(12) United States Patent
Jeon

(10) Patent No.: US 9,013,463 B2
(45) Date of Patent: Apr. 21, 2015

(54) ORGANIC LIGHT EMITTING DISPLAY INTEGRATED WITH TOUCH SCREEN PANEL

(75) Inventor: Mu-Kyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 259 days.

(21) Appl. No.: 13/620,348

(22) Filed: Sep. 14, 2012

(65) Prior Publication Data
US 2013/0321292 A1  Dec. 5, 2013

(30) Foreign Application Priority Data

Jun. 4, 2012  (KR) .................. 10-2012-0059818

(51) Int. Cl.
*G06F 5/00* (2006.01)
*G06F 3/041* (2006.01)
*G06F 3/044* (2006.01)
*H01L 27/32* (2006.01)

(52) U.S. Cl.
CPC .............. *G06F 3/0412* (2013.01); *G06F 3/044* (2013.01); *H01L 27/323* (2013.01)

(58) Field of Classification Search
CPC ...... G06F 3/0412; G06F 3/044; H01L 27/323
USPC .................... 345/173, 76, 211, 214
See application file for complete search history.

(56) References Cited

U.S. PATENT DOCUMENTS

| 7,663,607 | B2 | 2/2010 | Hotelling et al. | |
|---|---|---|---|---|
| 2002/0180721 | A1* | 12/2002 | Kimura et al. | 345/211 |
| 2003/0063081 | A1* | 4/2003 | Kimura et al. | 345/211 |
| 2010/0182273 | A1 | 7/2010 | Noguchi et al. | |
| 2011/0175846 | A1 | 7/2011 | Wang et al. | |
| 2011/0205220 | A1* | 8/2011 | Ota | 345/212 |
| 2011/0316802 | A1 | 12/2011 | Choi | |
| 2012/0105381 | A1 | 5/2012 | Lee et al. | |
| 2012/0249454 | A1* | 10/2012 | Teraguchi et al. | 345/173 |
| 2014/0240306 | A1* | 8/2014 | ISHIGURO et al. | 345/212 |

FOREIGN PATENT DOCUMENTS

| EP | 1 496 495 A2 | 1/2005 |
|---|---|---|
| KR | 10-2009-0019902 A | 2/2009 |
| KR | 10-2010-0127164 | 12/2010 |
| KR | 10-2012-0045290 | 5/2012 |
| WO | WO 2013/012667 A1 | 1/2013 |

OTHER PUBLICATIONS

EPO Search Report dated Sep. 13, 2013, for corresponding European Patent application 12190821.4, (8 pages).

* cited by examiner

*Primary Examiner* — Thuy Pardo
(74) *Attorney, Agent, or Firm* — Christie, Parker & Hales, LLP

(57) ABSTRACT

Embodiment of the present invention provide for an organic light emitting display with a touch screen panel, including a first substrate; a plurality of pixels on the first substrate; a plurality of signal lines and control lines on the first substrate and coupled to the pixels; a second substrate covering the first substrate; and first electrodes of a touch screen panel on the second substrate. Here, the control lines are second electrodes of the touch screen panel and are arranged in a direction that crosses the first electrodes.

12 Claims, 3 Drawing Sheets

ORGANIC LIGHT EMITTING DISPLAY INTEGRATED WITH TOUCH SCREEN PANEL

CROSS-REFERENCE TO RELATED APPLICATION

This application claims priority to and the benefit of Korean Patent Application No. 10-2012-0059818, filed on Jun. 4, 2012, in the Korean Intellectual Property Office, the entire content of which is incorporated herein by reference.

BACKGROUND

1. Field

Aspects of the present invention relate to an organic light emitting display, and more particularly, to an organic light emitting display integrated with a touch screen panel.

2. Description of the Related Art

A touch screen panel is an input device that provides a capability to select the content displayed on the screen of an image display device by a human hand or an object (e.g., a stylus) to input the command of a user.

Therefore, the touch screen panel may be provided on the entire surface of the image display device to convert a contact position of the human hand or the object into an electrical signal. The instruction contact selected in the contact position is received as an input signal.

Since the touch screen panel may replace an additional input device coupled to the image display device, such as, a keyboard or a mouse, the use range is increasing.

Examples of a touch screen panel type include a resistance layer type, a photo-sensing type, and an electro-capacitive type. Among the above types, the electro-capacitive type touch screen panel detects a change in capacitance formed by conductive sensing patterns together with other peripheral sensing patterns or a ground electrode when the human hand or another object contacts the touch screen panel to convert the contact position into the electrical signal.

The electro-capacitive touch screen panel may be attached to the external surface of a flat panel display (FPD) such as a liquid crystal display (LCD) and an organic light emitting display (OLED).

However, when the touch screen panel is attached to the external surface of the FPD, an adhesive layer between the touch screen panel and the FPD may be used and processes of manufacturing the touch screen panel are required in addition to the FPD, thereby increasing process time and process cost.

In addition, the touch screen panel may be attached to the external surface of the FPD so that the entire thickness of the FPD increases.

SUMMARY

Accordingly, embodiments of the present invention provide an organic light emitting display with an integrated touch screen panel, in which control lines arranged in a panel of an organic light emitting display are used as driving electrodes of an electro-capacitive touch screen panel, and in which a signal applied to the control lines during a touch recognition operation is input in synchronization with a signal applied to the display panel so as not to affect display.

In order to achieve the foregoing and/or other aspects of the present invention, an embodiment of the present invention provides an organic light emitting display with a touch screen panel, including a first substrate; a plurality of pixels on the first substrate; a plurality of signal lines and control lines on the first substrate and coupled to the pixels; a second substrate covering the first substrate; and first electrodes of a touch screen panel on the second substrate. Here, the control lines are second electrodes of the touch screen panel, and are arranged in a direction that crosses the first electrodes.

In an embodiment, a plurality of adjacent control lines may form a group, and one of the second electrodes of the touch screen panel includes the plurality of adjacent control lines that form the group.

The first electrodes may be sensing electrodes of the touch screen panel and the second electrodes may be driving electrodes of the touch screen panel.

The first electrodes may be in a display region of the second substrate corresponding to a region of the first substrate in which the pixels are located.

Sensing lines for coupling the first electrodes to a touch driving circuit through a first touch pad may be in a non-display region outside the display region.

In an embodiment, the control lines may be coupled to the touch driving circuit through a second touch pad, which is in a non-display region of the first substrate. The first touch pad on the second substrate may be coupled to the same touch driving circuit as the second touch pad unit on the first substrate.

In an embodiment, the control lines may be initialization driving control lines for providing an initialization voltage to the pixels.

Each of the pixels may include an organic light emitting diode (OLED), and a pixel circuit including: a first transistor configured to control an amount of current supplied to the OLED and having a gate electrode that is configured to be initialized by an initialization voltage; and a second transistor coupled between the gate electrode of the first transistor and a control line of the control lines to provide the initialization voltage to the gate electrode of the first transistor.

In an embodiment, the second transistor may be configured to provide an initialization voltage from the control line at a low level voltage that is lower than a voltage of data signals applied to the pixels. The control lines may be arranged in groups, each of the second electrodes of the touch screen panel may correspond to one of the groups of the control lines, pixel circuits (including the pixel circuit of each of the pixels) together may be configured to sequentially apply the initialization voltage to the groups of the control lines.

The pixel circuits together may be configured to apply a high level voltage to the groups of the control lines excluding a group of the control lines to which the low level voltage is applied.

In one embodiment, a cathode electrode of the OLED has openings at regions that overlap the control lines to expose the control lines, and the cathode electrode of the OLED is between the control lines and the first electrodes.

As described above, according to embodiments of the present invention, the control lines arranged in the panel of the organic light emitting display may be used as the driving electrodes of the electro-capacitive touch screen panel so that it is possible to realize the organic light emitting display in which the thin touch screen panel is mounted without additional processes.

In addition, the signal applied to the control lines during the touch recognition operation is input in synchronization with the signal input to the display panel so as not to affect display so that display and touch recognition operations may be concurrently (or simultaneously) performed.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
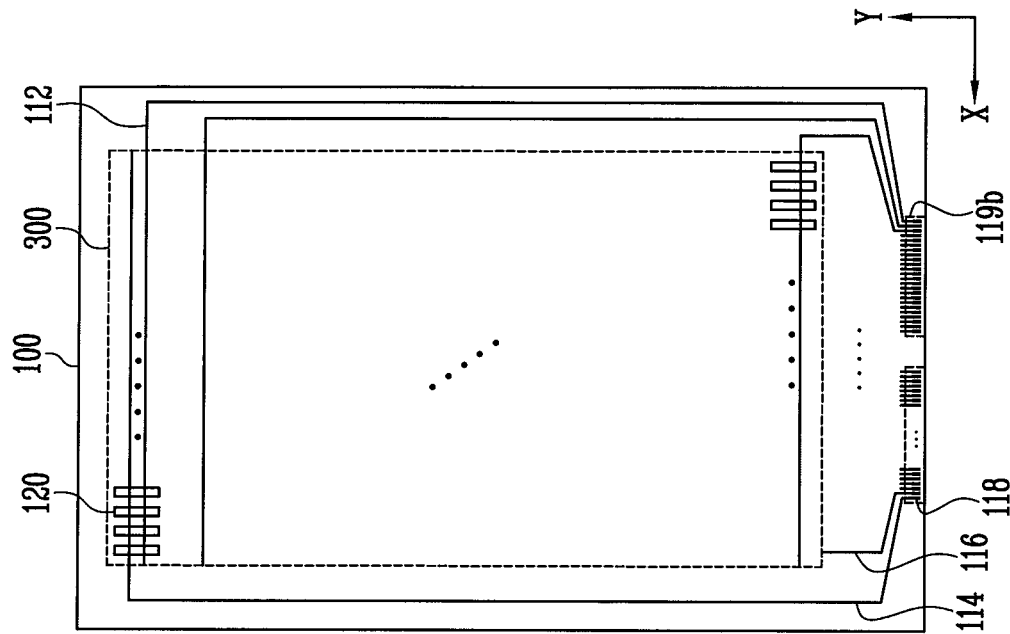
FIG. 1 is an exploded plan view of an organic light emitting display integrated with a touch screen panel according to an embodiment of the present invention.
Figure 1:
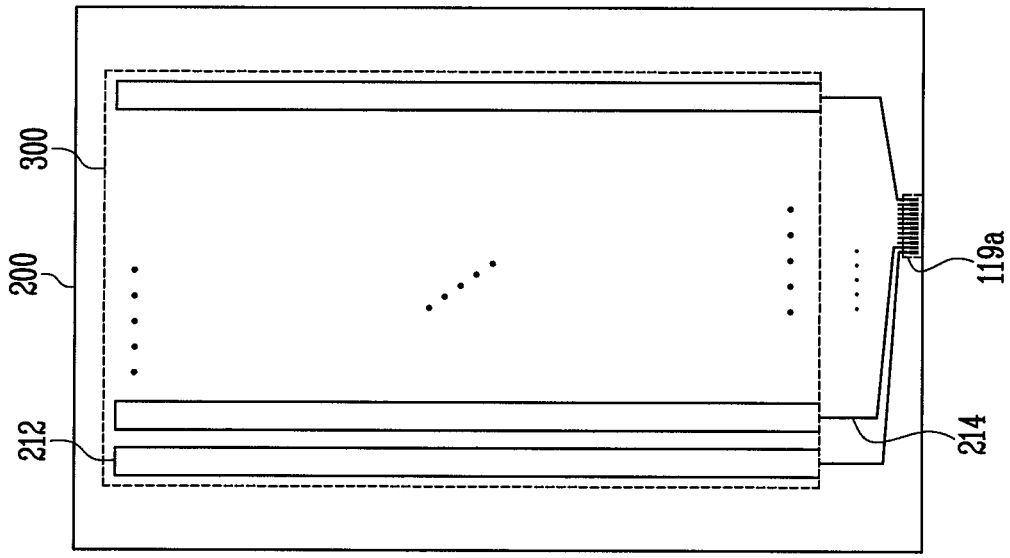

Hereinafter, certain exemplary embodiments according to the present invention will be described with reference to the accompanying drawings. Here, when an element is described as being coupled (e.g., electrically coupled or connected) to another element, that element may be directly coupled to the another element or may be indirectly coupled to the another element with one or more intervening elements interposed therebetween. Also, when an element is referred to as being "on" another element, it may be directly on the another element or may be indirectly on the another element with one or more intervening elements interposed therebetween. Further, some of the elements that are not essential to the complete understanding of the invention may be omitted for clarity. Also, like reference numerals refer to like elements throughout.

Hereinafter, the embodiments of the present invention will be described in detail with reference to the accompanying drawings.

FIG. 1 is an exploded plan view of an organic light emitting display integrated with a touch screen panel according to an embodiment of the present invention.

In the organic light emitting display integrated with the touch screen panel according to an embodiment of the present invention, first electrodes (sensing electrodes) 212 of the touch screen panel are on (e.g., directly formed, located, placed, or arranged on) one surface of a top substrate 200 of the touch screen panel and second electrodes (driving electrodes) of the touch screen panel are realized by initialization control lines 112 arranged on a bottom substrate 100 of the organic light emitting display.

Here, the top substrate 200, which may function as an encapsulating substrate of the organic light emitting display, may be formed of, for example, a glass material or a flexible thin film.

In addition, one surface of the top substrate 200 may be the external surface of the top substrate. For example, in FIG. 1, one surface of the top substrate 200 corresponds to the external surface of the top substrate 200.

While the above is one embodiment of the present invention, other embodiments of the present invention are not limited to the above. For example, the first electrodes 212 of the touch screen panel may be formed on an internal surface of the top substrate 200 (e.g., a surface facing toward the interior of the organic light emitting display).

Referring back to FIG. 1, the structure of the organic light emitting display integrated with the touch screen panel according to an embodiment of the present invention will now be described in more detail.

In the organic light emitting display integrated with the touch screen panel according to an embodiment of the present invention, the first electrodes 212 of the touch screen panel and sensing lines 214 for coupling the first electrodes 212 to an external touch driving circuit (not shown) through a first touch pad unit 119a are formed on one surface of the top substrate 200 that covers (e.g., seals up) the bottom substrate 100 with respect to a plurality of pixels 120 formed in a display region 300 of the top substrate 100.

Here, the first electrodes 212 may be formed at the display region 300 of the top substrate 200 and the sensing lines 214 may be formed at a non-display region positioned outside the display region 300 of the top substrate 200.

In addition, a plurality of signal lines and control lines may be coupled to the pixels 120 formed at the display region 300 of the bottom substrate 100. For example, FIG. 1 illustrates scan lines 114 and data lines 116 arranged as signal lines, and illustrates initialization driving control lines 112 arranged as control lines. Other lines, for example, emission control lines, may be additionally coupled to the pixels 120, however, for convenience, these other lines are not shown.

In addition, at least a portion of the initialization driving control lines 112 may be arranged in a first direction (the X axis direction) to run parallel (or substantially parallel) with at least a portion of the scan lines 114 (e.g., the portions within the display region 300). The plurality of pixels 120 formed in a row (like the scan lines 114) may be respectively coupled to the initialization driving control lines 112 (e.g., each of the pixels in a same row may be coupled to one of the initialization driving control lines arranged in the same row).

In addition, the signal lines (e.g., the scan lines 114 and the data lines 116) and the control lines (e.g., the initialization driving control lines 112) may be coupled to a driving pad unit 118 and a second touch pad unit 119b, respectively, to receive signals from a scan driving circuit, a data driving circuit, or a touch driving circuit, which are external driving circuits.

The first touch pad unit 119a formed on the top substrate 200 may be coupled to the same touch driving circuit (not shown) as the second touch pad unit 119b formed on the bottom substrate 100.

For example, when the touch driving circuit is electrically coupled to the second touch pad unit 119b formed on the bottom substrate 100 by a flexible printed circuit board (FPCB), the first touch pad unit 119a formed on the top substrate 200 may be coupled to the second touch pad unit 119b formed on the bottom substrate 100 through a conductive coupler (not shown), for example, a conductive ball, so that the second touch pad unit 119b may be electrically coupled to the touch driving circuit without an additional FPCB contacting the first touch pad unit 119a.

In the organic light emitting display integrated with the touch screen panel according to an embodiment of the present invention, driving electrodes (second electrodes) of the touch screen panel, which correspond to the first electrodes (sensing electrodes) 212 of the touch screen panel that are formed on one surface of the top substrate 200, are used as the initialization driving control lines 112 arranged on the bottom substrate 100.

That is, as illustrated in FIG. 1, the first electrodes 212 and the initialization driving control lines 112 (i.e., the second electrodes) are arranged to cross so that a plurality of sensing cells are formed at crossing points.

For example, when the first electrodes 212 are arranged in a second direction (the Y axis direction), the second electrodes 112 are arranged in the first direction (the X axis direction) to cross the first electrodes 212.

The first electrodes 212 (i.e., the sensing electrodes) formed on the top substrate 200 may have a larger width (e.g., a significantly larger width) than the initialization driving control lines 112 formed on the bottom substrate 100 as illustrated in FIG. 1. Further, a plurality of adjacent initialization driving control lines 112 may form a group, and the plurality of adjacent initialization driving control lines 112 that form the group may operate as one of the driving electrodes. The other driving electrodes may be realized similarly.

According to an embodiment of the present invention, in order to realize touch recognition through the sensing cells, during a touch recognition operation, a signal applied to the group of the initialization driving control lines 112, which operate as the driving electrode (the second electrode), is input in synchronization with a signal applied to the pixels associated with the group so as not to affect display.

A circuit structure of a pixel according to an embodiment of the present invention for realizing the above and the waveform of a driving signal supplied to the pixel will now be described in detail with reference to FIGS. 2 and 3.

Figure 2:
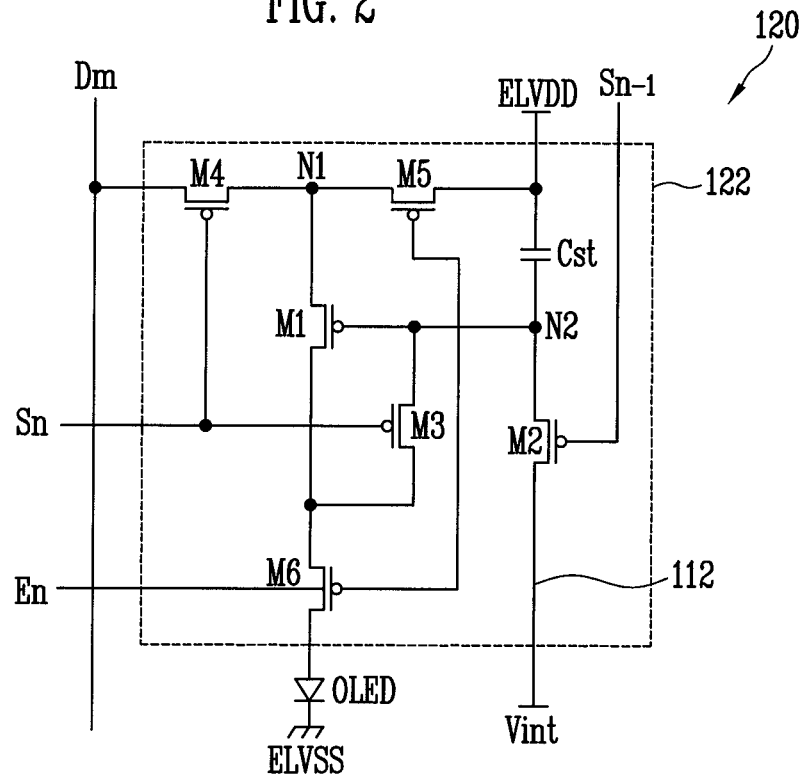
FIG. 2 is a circuit diagram of an embodiment of the pixel illustrated in FIG. 1.

FIG. 2 is a circuit diagram of an embodiment of a pixel illustrated in FIG. 1. FIG. 3 is a waveform chart of a driving signal supplied to the pixel illustrated in FIG. 2.

Referring to FIG. 2, a pixel 120 according to an embodiment of the present invention includes an organic light emitting diode (OLED), a data line Dm, scan lines Sn−1 and Sn, an emission control line En, and a pixel circuit 122 coupled to an initialization driving control line 112 of the plurality of initialization driving control lines 112 for supplying an initialization voltage Vint to control an amount of current supplied to the OLED.

An anode electrode of the OLED is coupled to the pixel circuit 122 and a cathode electrode of the OLED is coupled to a second power source ELVSS. Here, the voltage value of the second power source ELVSS is set to be lower than the voltage value of a first power source ELVDD. The OLED generates light with a suitable (e.g., predetermined) brightness to correspond to the amount of current supplied from the pixel circuit 122.

The pixel circuit 122 controls the amount of current supplied to the OLED to correspond to a data signal supplied to the data line Dm when a scan signal is supplied to the scan line Sn. Accordingly, the pixel circuit 122 may include first to sixth transistors M1 to M6 and a storage capacitor Cst.

A first electrode of a fourth transistor M4 may be coupled to the data line Dm, and a second electrode of the fourth transistor M4 may be coupled to a first node N1. A gate electrode of the fourth transistor M4 may be coupled to an nth scan line Sn. In an embodiment, the fourth transistor M4 is turned on according to the scan signal supplied to the nth scan line Sn to supply the data signal supplied to the data line Dm to the first node N1.

A first electrode of the first transistor M1 may be coupled to the first node N1, and a second electrode of the first transistor M1 may be coupled to a first electrode of the sixth transistor M6. A gate electrode of the first transistor M1 may be coupled to a second node N2. Here, the first transistor M1 supplies current corresponding to a voltage charged in the storage capacitor Cst to the OLED.

A first electrode of a third transistor M3 may be coupled to a second electrode of the first transistor M1, and a second electrode of the third transistor M3 may be coupled to the second node N2. A gate electrode of the third transistor M3 may be coupled to the nth scan line Sn. The third transistor M3 is turned on according to the scan signal supplied to the nth scan line Sn to couple the first transistor M1 in the form of a diode.

A second transistor M2 may be coupled between the second node N2 and the initialization voltage Vint. A gate electrode of the second transistor M2 may be coupled to an (n−1)th scan line Sn−1. The second transistor M2 is turned on according to an (n−1)th scan signal supplied to the (n−1)th scan line Sn−1 to supply the initialization voltage Vint to the second node N2.

A first electrode of a fifth transistor M5 may be coupled to the first power source ELVDD and a second electrode of the fifth transistor M5 may be coupled to the first node N1. A gate electrode of the fifth transistor M5 may be coupled to the emission control line En. The fifth transistor M5 is turned on according to an emission control signal supplied from the emission control line En to couple (e.g., electrically couple) the first power source ELVDD to the first node N1.

The first electrode of the sixth transistor M6 may be coupled to the second electrode of the first transistor M1 and a second electrode of the sixth transistor M6 may be coupled to the anode electrode of the OLED. A gate electrode of the sixth transistor M6 may be coupled to the emission control line En. The sixth transistor M6 is turned on according to an emission control signal to supply current supplied from the first transistor M1 to the OLED.

As described above, the pixel illustrated in FIG. 2 displays a suitable (e.g., predetermined) image by applying a signal.

According to an embodiment of the present invention, the initialization voltage Vint initializes the second node N2. Here, the initialization voltage Vint may be set to be a lower voltage than a data signal.

In an embodiment of the present invention, the initialization driving control lines 112 to which the initialization voltage is applied function as the driving electrodes of the touch screen panel.

Therefore, the initialization voltage Vint applied to the initialization driving control lines 112 may not always be at a low level voltage that is lower than the data signal, but, instead, the initialization voltage Vint may be a touch driving signal that is sequentially applied to the initialization driving control lines 112 that operate as the driving electrodes by group (e.g., predetermined group).

Figure 3:
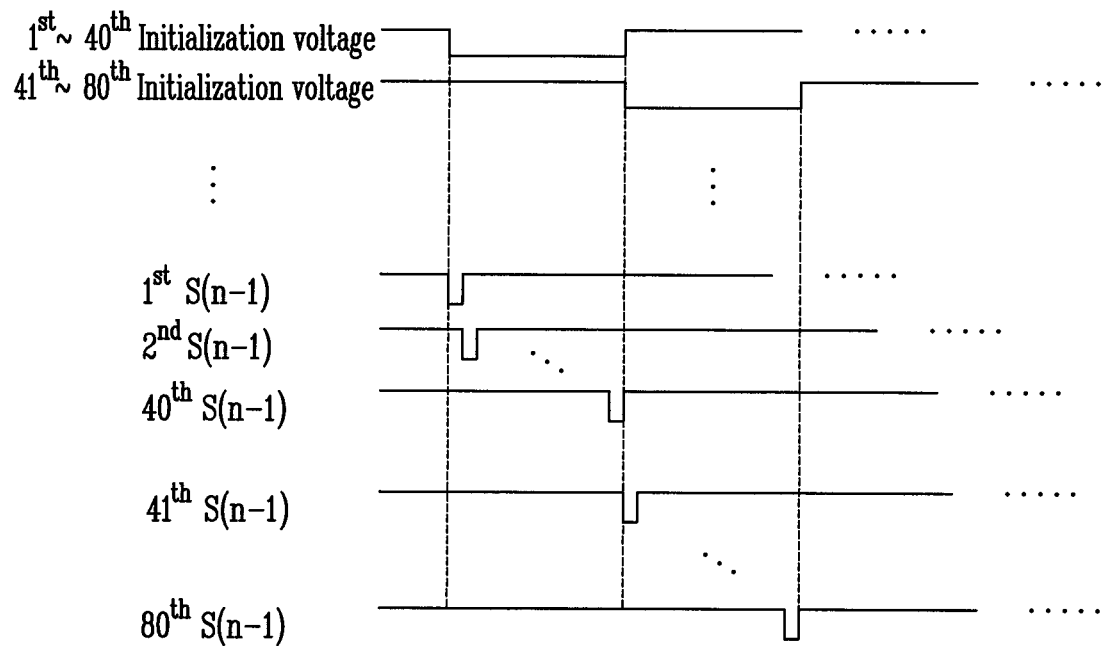
FIG. 3 is a waveform chart of a driving signal supplied to the pixel illustrated in FIG. 2.

In FIG. 3, a subset of the plurality of initialization driving control lines 112 arranged in the first direction (the X axis direction), for example, 40 initialization driving control lines, form a group that operates as a driving electrode (a second electrode) of the plurality of driving electrodes.

For example, $1^{st}$ to $40^{th}$ initialization driving control lines 112 may operate as a first driving electrode, $41^{st}$ to $80^{th}$ initialization driving control lines 112 may operate as a second driving electrode, and other groups each formed of the same number of initialization driving control lines 112 may operate as subsequent driving electrodes.

The initialization driving control lines 112 are arranged in the first direction (the X axis direction) to run parallel with the scan lines Sn and Sn−1 and a plurality of pixels 120 formed in a row (like the scan lines) are coupled to the initialization driving control lines 112.

The low level initialization voltage Vint may be applied when the scan signal is applied to any one of the (n−1)th scan lines Sn−1 in a group (e.g., a group of 40 row lines) coupled to one of the driving electrodes, and a high level initialization voltage Vint may be applied during the remaining periods.

Therefore, since the low level initialization voltage Vint applied to the driving electrodes is sequentially applied to the initialization driving control lines 112 by group as illustrated in FIG. 3, the low level initialization voltage Vint may be used as a driving signal of a touch screen panel.

In addition, since the low level initialization voltage Vint is applied to pixels when the scan signal is applied to the corresponding row lines, the second node N2 of the pixels may be initialized. Since data is not written in pixels when the scan signal is not applied to the corresponding row lines, a high level initialization voltage Vint may be applied instead of a low level initialization voltage Vint without deteriorating the image display.

As a result, like the signal waveform chart illustrated in FIG. 3, the low level initialization voltage Vint is sequentially applied in synchronization with the scan signal applied to the row lines corresponding to the driving electrode groups so that display and touch recognition operations may be concurrently (or simultaneously) performed.

Figure 4:
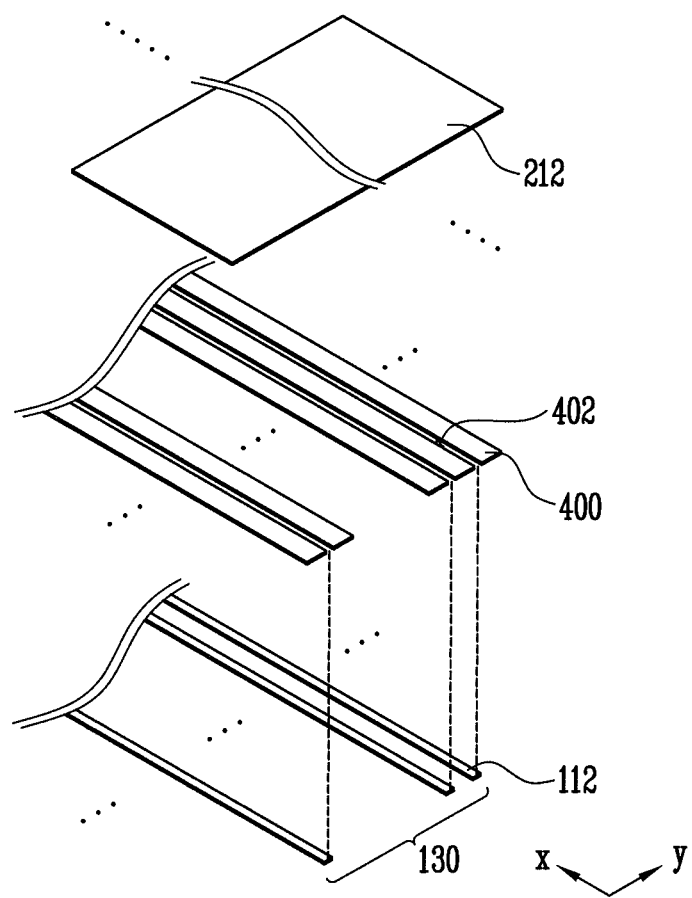
FIG. 4 is a perspective view schematically illustrating structures of driving electrodes and sensing electrodes of the touch screen panel according to an embodiment of the present invention.

FIG. 4 is a perspective view schematically illustrating structures of driving electrodes and sensing electrodes of the touch screen panel according to an embodiment of the present invention.

Referring to FIG. 4, driving electrodes (second electrodes) 130 are realized by a group of a plurality of the initialization driving control lines 112 arranged on the bottom substrate 100 in the first direction (the X axis direction), and the sensing electrodes 212 corresponding to the driving electrodes 130 are realized by first electrodes 212 formed on one surface of the top substrate 200 in the second direction (the Y direction) that cross the first direction.

An insulating layer (not shown) provided between the driving electrodes 130 and the sensing electrodes 212 and the top substrate 200 function as dielectric substances.

In the organic light emitting display according to an embodiment of the present invention, a cathode electrode 400 of an OLED may be formed on the initialization driving control lines 112 formed on the bottom substrate 100.

In this case, since it may be difficult to form an electric field between the driving electrodes 130 (realized by the initialization driving control lines 112) and the sensing electrodes 212 on the top substrate 200, openings 402 may be formed in the regions of the cathode electrode 400 that overlap the initialization driving control lines 112 so that the initialization driving control lines 112 are exposed.

Mutual capacitances $C_M$ between the driving electrodes 130 and the sensing electrodes 212 are formed at the points where the driving electrodes 130 and the sensing electrodes 212 cross each other. The crossing points at which the mutual capacitances $C_M$ are formed function as sensing cells that realize touch recognition.

Here, the mutual capacitances $C_M$ generated by the sensing cells apply a coupled sensing signal to the sensing electrodes 212 coupled to the sensing cells when a driving signal is applied to the driving electrodes 130 coupled to the sensing cells.

In addition, the driving signal may be sequentially applied to the driving electrodes 130 in one frame as described with reference to FIG. 3. That is, when the low level initialization voltage Vint is applied as the driving signal to one of the driving electrodes, a high level voltage is applied to the other driving electrodes.

Therefore, the mutual capacitances $C_M$ are formed at the plurality of crossing points formed by the plurality of sensing electrodes 212 that cross the driving electrodes 130 to which the driving signal is applied, that is, the mutual capacitances $C_M$ are formed at the sensing cells. When a finger (or other object) contacts the sensing cells, a change in capacitance is generated by the sensing cells, and that change may be sensed.

Therefore, according to the embodiment of the present invention, the organic light emitting display integrated with the electro-capacitive touch screen panel may be realized.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display with a touch screen panel, comprising:
    a first substrate;
    a plurality of pixels on the first substrate;
    a plurality of signal lines and control lines on the first substrate and coupled to the pixels;
    a second substrate covering the first substrate; and
    first electrodes of the touch screen panel on the second substrate,
    wherein the control lines comprise second electrodes of the touch screen panel, and are arranged in a direction that crosses the first electrodes, and
    wherein the control lines comprise initialization driving control lines for providing an initialization voltage to the pixels in response to a signal that is provided to a previous one of the signal lines.

2. The organic light emitting display with the touch screen panel as claimed in claim 1,
    wherein a plurality of adjacent control lines form a group, and
    wherein one of the second electrodes of the touch screen panel comprises the plurality of adjacent control lines that form the group.

3. The organic light emitting display with the touch screen panel as claimed in claim 2,
    wherein the first electrodes comprise sensing electrodes of the touch screen panel, and
    wherein the second electrodes comprise driving electrodes of the touch screen panel.

4. The organic light emitting display with the touch screen panel as claimed in claim 1, wherein the first electrodes are in a display region of the second substrate corresponding to a region of the first substrate in which the pixels are located.

5. The organic light emitting display with the touch screen panel as claimed in claim 4, wherein sensing lines for coupling the first electrodes to a touch driving circuit through a first touch pad are in a non-display region outside the display region.

6. The organic light emitting display with the touch screen panel as claimed in claim 5, wherein the control lines are coupled to the touch driving circuit through a second touch pad, which is in a non-display region of the first substrate.

7. The organic light emitting display with the touch screen panel as claimed in claim 6, wherein the first touch pad on the second substrate is coupled to the same touch driving circuit as the second touch pad on the first substrate.

8. The organic light emitting display with the touch screen panel as claimed in claim 1, wherein each of the pixels comprises:
    an organic light emitting diode (OLED); and
    a pixel circuit comprising:
        a first transistor configured to control an amount of current supplied to the OLED and comprising a gate electrode which is configured to be initialized by an initialization voltage; and
        a second transistor coupled between the gate electrode of the first transistor and a control line of the control lines, the second transistor being configured to provide the initialization voltage to the gate electrode of the first transistor.

9. The organic light emitting display with the touch screen panel as claimed in claim 8, wherein the second transistor is configured to provide the initialization voltage from the control line at a low level voltage that is lower than a voltage of data signals applied to the pixels.

10. The organic light emitting display with the touch screen panel as claimed in claim 9,
   wherein the control lines are arranged in groups,
   wherein each of the second electrodes of the touch screen panel corresponds to one of the groups of the control lines,
   pixel circuits, comprising the pixel circuit of each of the pixels, together are configured to sequentially apply the initialization voltage to the groups of the control lines.

11. The organic light emitting display with the touch screen panel as claimed in claim 10, wherein the pixels circuits together are configured to apply a high level voltage to the groups of the control lines excluding a group of the control lines to which the low level voltage is applied.

12. The organic light emitting display with the touch screen panel as claimed in claim 8,
   wherein a cathode electrode of the OLED has openings at regions that overlap the control lines to expose the control lines, and
   wherein the cathode electrode of the OLED is between the control lines and the first electrodes.

* * * * *